US007153445B2

United States Patent
Bernards et al.

(10) Patent No.: US 7,153,445 B2
(45) Date of Patent: Dec. 26, 2006

(54) METHOD FOR ROUGHENING COPPER SURFACES FOR BONDING TO SUBSTRATES

(75) Inventors: Roger Bernards, Buffalo, MN (US); Hector Gonzalez, Crystal, MN (US); Al Kucera, Maple Grove, MN (US); Mike Schanhaar, Crystal, MN (US)

(73) Assignee: Electrochemicals Inc., Maple Plain, MN (US)

( * ) Notice: Subject to any disclaimer, the term of this patent is extended or adjusted under 35 U.S.C. 154(b) by 435 days.

(21) Appl. No.: 10/028,955

(22) Filed: Dec. 18, 2001

(65) Prior Publication Data

US 2002/0084441 A1 Jul. 4, 2002

Related U.S. Application Data

(62) Division of application No. 09/479,089, filed on Jan. 7, 2000.

(51) Int. Cl.
*C23F 1/00* (2006.01)
(52) U.S. Cl. .................... 216/95; 216/13; 216/100; 216/106; 252/79.1
(58) Field of Classification Search .............. 216/13, 216/106, 95, 100; 427/327, 96; 252/79.1
See application file for complete search history.

(56) References Cited

U.S. PATENT DOCUMENTS

| | | | |
|---|---|---|---|
| 3,756,957 A | 9/1973 | Shiga | |
| 4,512,818 A | 4/1985 | Valayil et al. | 148/6.14 R |
| 5,073,456 A | 12/1991 | Palladino | 428/446 |
| 5,532,094 A | 7/1996 | Arimura et al. | 252/79.1 |
| 5,800,859 A | 9/1998 | Price et al. | 427/98 |
| 5,861,076 A | 1/1999 | Adlam et al. | 156/281 |
| 5,869,130 A | 2/1999 | Ferrier | 427/98 |
| 5,910,255 A * | 6/1999 | Noddin | 216/18 |
| 5,931,996 A | 8/1999 | Reisser et al. | 106/404 |
| 5,985,998 A | 11/1999 | Sommerfeld et al. | 525/72 |
| 6,054,061 A * | 4/2000 | Bayes et al. | 216/13 |
| 6,106,899 A * | 8/2000 | Nakagawa et al. | 427/327 |
| 6,136,502 A | 10/2000 | Satoshi et al. | 430/270.1 |
| 6,146,701 A | 11/2000 | Ferrier | 427/327 |
| 6,162,503 A | 12/2000 | Ferrier | 427/327 |

(Continued)

FOREIGN PATENT DOCUMENTS

JP 11-029883 A * 2/1999

(Continued)

*Primary Examiner*—Shamim Ahmed
(74) *Attorney, Agent, or Firm*—McAndrews, Held & Malloy, Ltd.

(57) ABSTRACT

The invention is directed to a method and composition for providing roughened copper surfaces suitable for subsequent multilayer lamination. A smooth copper surface is contacted with an adhesion promoting composition under conditions effective to provide a roughened copper surface, the adhesion promoting composition consisting essentially of an oxidizer, a pH adjuster, a topography modifier, and a uniformity enhancer. A coating promoter may be used in place of the uniformity enhancer or in addition to the uniformity enhancer. The adhesion promoting composition does not require a surfactant. The process may further comprise the step of contacting the uniform roughened copper surface with a post-dip, wherein the post-dip comprises an azole or silane compound or a combination of said azole and said silane. The post-dip may further comprise, alone or in combination, a titanate, a zirconate, and an aluminate. The pH adjuster is preferably sulfuric acid and the oxidizer is preferably hydrogen peroxide. A hydrogen peroxide stabilizer may be used in the adhesion promoting composition.

14 Claims, 3 Drawing Sheets

U.S. PATENT DOCUMENTS

| | | | |
|---|---|---|---|
| 6,261,466 B1 | 7/2001 | Bayes et al. | 216/13 |
| 6,284,309 B1* | 9/2001 | Bishop et al. | 216/106 |
| 6,383,272 B1* | 5/2002 | Ferrier | 216/106 |
| 6,521,139 B1* | 2/2003 | Kondo et al. | 216/13 |
| 6,544,436 B1* | 4/2003 | Morikawa et al. | 216/106 |
| 6,666,987 B1* | 12/2003 | Morikawa et al. | 252/79.4 |
| 2001/0000884 A1 | 5/2001 | Miller et al. | 174/259 |
| 2002/0038790 A1* | 4/2002 | Kurii et al. | 216/106 |

FOREIGN PATENT DOCUMENTS

| | | |
|---|---|---|
| WO | WO 98/19217 | 5/1998 |
| WO | WO 99/40764 | 8/1999 |
| WO | WO 99/40765 | 8/1999 |
| WO | WO 01/29289 A1 | 4/2001 |
| WO | WO 01/29290 A1 | 4/2001 |
| WO | WO 01/49805 | 7/2002 |

* cited by examiner

X = Carbon or Nitrogen atom
Y = Carbon or Nitrogen atom
1 = position 1 in fused heterocyclic ring X = Carbon or Nitrogen atom
Y = Carbon or Nitrogen atom
1 = position 1 in heterocyclic ring

METHOD FOR ROUGHENING COPPER SURFACES FOR BONDING TO SUBSTRATES

CROSS-REFERENCE TO RELATED APPLICATIONS

Not applicable.

STATEMENT REGARDING FEDERALLY SPONSORED RESEARCH OR DEVELOPMENT

Not Applicable.

BACKGROUND OF THE INVENTION

This application is a divisional of U.S. patent application Ser. No. 09/479,089 filed Jan. 7, 2000 pending entitled "Method For Roughening Copper Surfaces For Bonding To Substrates". The '089 application is incorporated herein by reference in its entirety.

This invention relates to preparing copper surfaces for bonding to substrates used in the manufacture of printed circuit boards (PCB's). More particularly, the invention relates to the manufacture of multilayer PCB's.

Multilayer PCB's are constructed by interleaving imaged conductive layers of copper with dielectric layers to make a multilayer sandwich. The dielectric layers are organic resin layers that bond the copper layers together. The layers of copper and dielectric are bonded together by the application of heat and pressure. The surface of the copper is smooth and does not bond easily to the dielectric layer.

Improved bonding can be achieved by etching or otherwise roughening the surface of the copper to provide microscopic crevices and ridges in the surface of the copper. The copper surface may be roughened mechanically. However, delicate circuit patterns are susceptible to damage if mechanically roughened. Thus, there is a need for a copper surface roughening process that does not require mechanical roughening of the copper surface.

Oxide processes are also known in which an oxide having a rough surface is formed on the copper surface. The oxide may be formed by chemical treatment of the copper. Oxide processes have many shortcomings. A typical oxide process is run at such high temperatures that the substrate is often distorted, leading to quality control problems and additional production costs. The oxidation process is also associated with uniformity problems in which portions of the copper surface are not oxidized or coated by the oxidizing solution. Uniformity problems lead to partial delamination in the multilayer PCB's. To avoid this problem the PCB is run through multiple passes to obtain a more uniform oxide coating. Performing multiple passes adds considerably to production cost. Thus, there is a need for a copper roughening process that does not require multiple passes or high temperature.

Multilayer PCBs tend to have a sharp transition between each layer of etched copper surface and each layer of organic resin. Thus, there is a need for a coating promoter to facilitate the adhesion of the organic resin to the roughened copper surface.

U.S. Pat. No. 4,512,818 describes a treatment solution for the formation of a black oxide on copper surfaces of multi-layered printed circuits. The treatment solution comprises an oxidant and a hydroxide and is characterized by the addition of a water soluble or dispersible polymer to regulate the properties of the black oxide solution.

It is reported that major drawbacks of the black oxide procedure include marginal bond strengths and high temperature processing. Resulting surface coatings are prone to mechanical damage and partial delamination around through-holes; this problem is called "pink ring." Pink ring is caused by the removal of the bonding oxide layer by through-hole cleaning and electroplating chemicals. Thus, there is a need for a formulation that is less prone to cause pink ring problems.

U.S. Pat. No. 5,861,076 describes a bond enhancement process for promoting strong, stable adhesive bonds between surfaces of copper foil and adjacent resin impregnated substrates or superimposed metallic sublayers. According to the process of the invention, a black oxide-coated copper surface is treated with an aqueous reducing solution containing sodium metabisulfite and sodium sulfide to convert the black oxide coating to a roughened metallic copper coating. The roughened metallic copper-coated surface is then passivated and laminated to a resin impregnated substrate.

In the chemical oxide modification process a strong reducing agent, typically dimethylamine borane, is applied to the oxide coating to obtain an even oxide coating. This type of adhesion promotion process produces an oxide coating that is fragile and prone to scratching during handling. Inspection of the circuitry prior to lamination is difficult because of the fragility of the oxide coating. Therefore, there is a need for an adhesion promotion process that permits a less problematic inspection after the adhesion promotion process and prior to the lamination step.

A method for roughening copper or copper alloy surfaces is described in U.S. Pat. No. 5,532,094. The copper surface is treated with an aqueous solution comprising an azole compound, a soluble copper compound, an organic or inorganic acid and a halogen ion.

U.S. Pat. No. 5,073,456 is directed to the manufacture of multilayer printed circuit boards having a number of through-holes that are formed by employing intermediate layers when bonding copper circuitry to an insulating layer.

U.S. Pat. Nos. 3,756,957, and 5,800,859 describe a range of hydrogen peroxide stabilizers; U.S. Pat. Nos. 3,756,957 and 5,800,859 are hereby incorporated by reference in their entirety. Alpha Metals sells an adhesion promoting solution under the registered trademark "Alpha Prep."

U.S. Pat. No. 5,800,859 describes a process for providing copper coating printed circuit boards. The process includes a treating step in which a metal surface is contacted with an adhesion promotion material. The adhesion promotion material includes 0.1 to 20% by weight hydrogen peroxide, an inorganic acid, an organic corrosion inhibitor and a surfactant. The surfactant is preferably a cationic surfactant, usually an amine surfactant and most preferably a quaternary ammonium surfactant.

BRIEF SUMMARY OF THE INVENTION

Accordingly, an object of this invention is to provide a copper surface roughening process that does not require mechanical roughening of the copper surface.

Another object is to provide a copper roughening process that does not require multiple passes or high temperature.

Another object is to provide a copper roughening process that does not require a highly alkaline solution.

A further object is to provide a composition that optionally comprises a coating promoter.

Another object is to provide a simpler process to produce a roughened copper surface that is not reliant on a cationic surfactant to achieve excellent copper surface area.

At least one of these objects is addressed, in whole or in part, by the present invention. The invention is a composition and method for roughening a copper surface in order to provide higher bond strengths between the copper and dielectric resin layers in a multilayer PCB. The composition consists essentially of an oxidizer, a pH adjuster, a topography modifier, and at least one of a uniformity enhancer and a coating promoter.

DETAILED DESCRIPTION OF THE INVENTION

While the invention will be described in connection with one or more embodiments, it will be understood that the invention is not limited to those embodiments. On the contrary, the invention includes all alternatives, modifications, and equivalents as may be included within the spirit and scope of the appended claims.

As noted above, one aspect of the present invention is a composition for roughening a copper surface, consisting essentially of an oxidizer, a pH adjuster, a topography modifier, and at least one of a uniformity enhancer and a coating promoter.

The oxidizer is preferably hydrogen peroxide and is preferably present in the range between about 0.1% and 5% (proportions of hydrogen peroxide in this specification are based on the use of 50 wt. % hydrogen peroxide in aqueous solution unless otherwise indicated) and more preferably in the range between about 0.1% and about 2%. Alternatively, the hydrogen peroxide is preferably present in the range between about 1% and 3.5% (based on 50 wt. % hydrogen peroxide) and more preferably in the range between about 1% and 2% (based on 50 wt. % hydrogen peroxide).

A hydrogen peroxide stabilizer is not required to practice this invention. However, a hydrogen peroxide stabilizer may be used. Non-limiting examples of optional hydrogen peroxide stabilizers include: alkyl monoamines having 2 to 10 carbon atoms, and their salts; polymethylenediamines having 4 to 12 carbon atoms and their salts; alkoxyamines formed by substituting at least one hydrogen atom of ammonia by an alkoxy radical having 2 to 6 carbon atoms and alkoxyamines formed by substituting at least one hydrogen atom connected with the nitrogen atom of an alkyl monoamine having 2 to 10 carbon atoms by an alkoxy radical having 2 to 6 carbon atoms; alkyl acyl radical formed by substituting at least one hydrogen atom of ammonia by an alkyl acyl radical having 3 to 6 carbon atoms, and at least one alkyl acid amide formed by substituting at least one alkyl monoamine having 2 to 10 carbon atoms by an alkyl acyl radical having 3 to 6 carbon atoms; alicyclic imines having a 5 to 8 membered ring; mono-n-propylamine, di-n-propylamine, tri-n-propylamine and hexamethylenediamine; octylamine; and propionylamide.

The choice of pH adjuster is not critical. Any suitable organic or inorganic acid may be used, although nitric acid is not preferred. Non-limiting examples of suitable acids include sulfuric, phosphoric, acetic, formic, sulfamic, and hydroxy-acetic acid. Sulfuric acid is the preferred pH adjuster. Sulfuric acid is present in the range between about 0.01% and 20% by weight and alternatively in the range between about 0.5% and 10% by weight.

Figure 1:
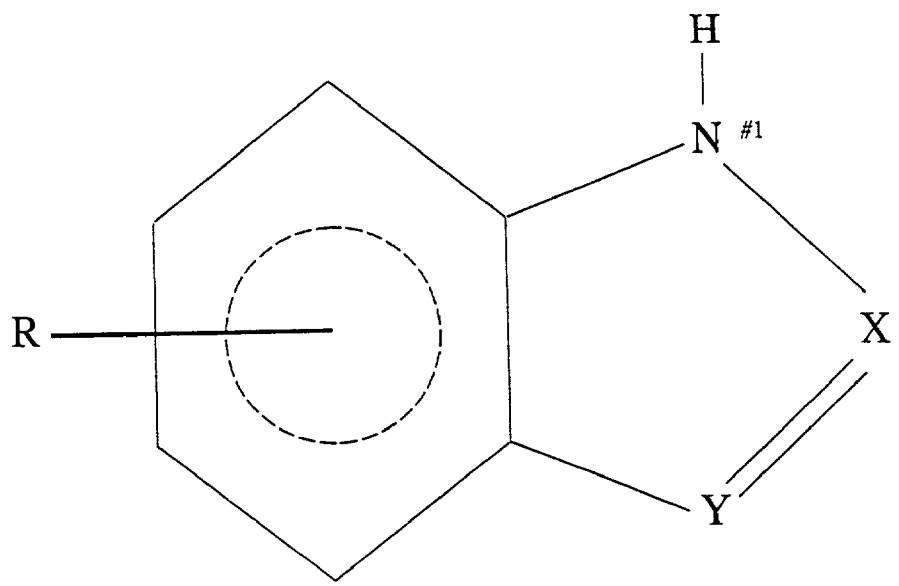
FIG. 1 is a schematic figure of a five membered aromatic fused N-heterocyclic ring compound with one to three nitrogen atoms in the N-heterocyclic ring. The nitrogen atom at the #1 position in the fused ring is bonded to a hydrogen atom.

Suitable topography modifiers are five membered aromatic fused N-heterocyclic ring compounds (hereinafter "N-heterocyclic compounds") with at least one nitrogen atom in the N-heterocyclic ring. At least one of the nitrogen atoms in the heterocyclic ring is bonded directly to a hydrogen atom. The nitrogen atom at the #1 position in the heterocyclic ring is preferably bonded to a hydrogen atom (see FIG. 1). Non-limiting examples of suitable topography modifiers include 1H-benzotriazole (CAS registration number, "CAS":95-14-7), 1H-indole (CAS 120-72-9), 1H-indazole (CAS 271-44-3), and 1H-benzimidazole (CAS 51-17-2). Derivatives of N-heterocyclic compounds suitable as topography modifiers include N-heterocyclic compounds with a hydrogen atom bonded to the nitrogen atom at the #1 position in the heterocyclic ring. The R substituents on the aromatic ring (see FIG. 1) may be alkyl, hydroxyalkyl, aminoalkyl, nitroalkyl, mercaptoalkyl, or alkoxy groups containing from 1 to about 10 or more carbon atoms. Specific examples of alkyl groups include methyl, ethyl, propyl, isopropyl, n-butyl, sec-butyl, tert-butyl, amyl, etc.

Non-limiting examples of suitable derivatives of 1H-benzotriazole (CAS 95-14-7) suitable for use as topography modifiers include: 5-methyl-1H-benzotriazole (CAS 136-85-6), 6-Nitro-1H-benzotriazole (CAS 2338-12-7), 1H-naphtho(1,2-d)triazole (CAS 233-59-0), and 1H-Naphtho[2,3-d]triazole (CAS 269-12-5).

Non-limiting examples of suitable derivatives of indole (1H-Indole; CAS 120-72-9) suitable for use as topography modifiers include: 5-Aminoindole (1H-Indol-5-amine; CAS 5192-03-0), 6-methylindole (1H-Indole, 6-methyl-; CAS 3420-02-8), 1H-indole-5-methyl (CAS 614-96-0), 7-methylindol (1H-Indole, 7-methyl-; CAS 933-67-5), 3-methylindole (1H-Indole, 3-methyl-; CAS 83-34-1), 2-Methylindole (2-Methyl-1H-indole; CAS 95-20-5), 1H-Indole, 3,5-dimethyl- (CAS 3189-12-6), 2,3-Dimethylindole (1H-Indole, 2,3-dimethyl-; CAS 91-55-4), and 2,6-dimethylindole (1H-Indole, 2,6-dimethyl-; CAS 5649-36-5).

Non-limiting examples of suitable derivatives of 1H-indazole (CAS 271-44-3) suitable for use as topography modifiers include: 1H-Indazol-5-amine (CAS 19335-11-6) and 3-Chloro-1H-indazole (CAS 29110-74-5).

Non-limiting examples of suitable derivatives of 1H-benzimidazole (CAS 51-17-2) suitable for use as topography modifiers include: 2-Hydroxy-1H-benzimidazole (CAS 615-16-7), 2-Methyl-1H-benzimidazole (CAS 615-15-6), and 2-(methylthio)-1H-Benzimidazole (CAS 7152-24-1).

The topography modifier is preferably present in the range between about 0.1 g/l (grams per liter) and 20 g/l and more preferably in the range between about 0.5 g/l and 7 g/l. For example, 1H-benzotriazole can be present in the range between about 0.1 g/l (grams per liter) and 20 g/l and more preferably in the range between about 0.5 g/l and 7 g/l.

The inventors present the following theory of operation of this invention. The present invention is not limited to processes or products that operate as specified by this theory. Any inaccuracy in this theory does not limit the scope of the present invention. The topography modifier is thought to vary the surface characteristics of the copper during treatment of the copper surface with the adhesion promoting solution of the invention. During treatment with the adhesion promoting solution of the invention, the copper surface is believed to comprise a complex of copper together with the topography modifier to produce a greater surface area than would be possible without the topography modifier. The topography modifier is essential to the invention because it has a beneficial effect on peel strength. Peel strength is dramatically reduced if the topography modifier is not used in the adhesion promoting solution.

Figure 2:
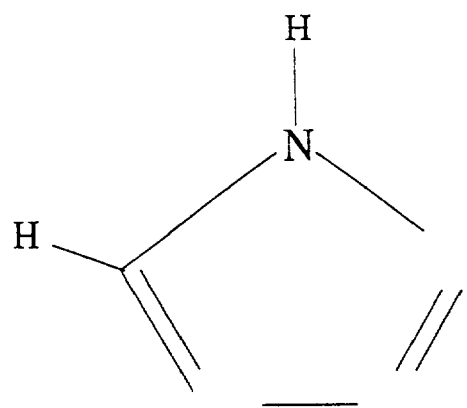
FIG. 2 is the molecular structure of 1H-tetrazole (CAS 288-94-8).
Figure 3:
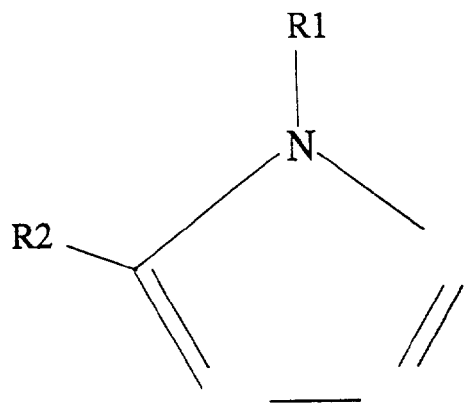
FIG. 3 is the molecular structure of derivatives of 1H-tetrazole (CAS 288-94-8).

The uniformity enhancer is a tetrazole such as 1H-tetrazole (CAS 288-94-8, FIG. 2) and its derivatives (FIG. 3). Non-limiting examples of suitable tetrazole derivatives that can be used in the present invention as a uniformity enhancer include: 5-aminotetrazole (CAS 5378-49-4), 5-methyltetrazole (CAS 4076-36-2), 5-methylaminotetrazole (CAS 53010-03-0), 1H-tetrazol-5-amine (CAS 4418-61-5), 1H-tetrazol-5-amine, N,N-dimethyl- (CAS 5422-45-7), 1-methyltetrazole (CAS 16681-77-9), 1-methyl-5-mercaptotetrazole, 1,5-dimethyltetrazole (CAS 5144-11-6), 1-methyl-5-aminotetrazole (CAS 5422-44-6), and 1-methyl-5-methylamino-tetrazole (CAS 17267-51-5).

Referring to FIG. 3, the R1 and R2 substituents on the tetrazole ring may be hydroxyl, amino, alkyl, hydroxyalkyl, aminoalkyl, nitroalkyl, mercaptoalkyl, or alkoxy groups containing from 1 to about 10 or more carbon atoms. Specific examples of alkyl groups include methyl, ethyl, propyl, isopropyl, n-butyl, sec-butyl, tert-butyl, amyl, etc.

Figure 4:
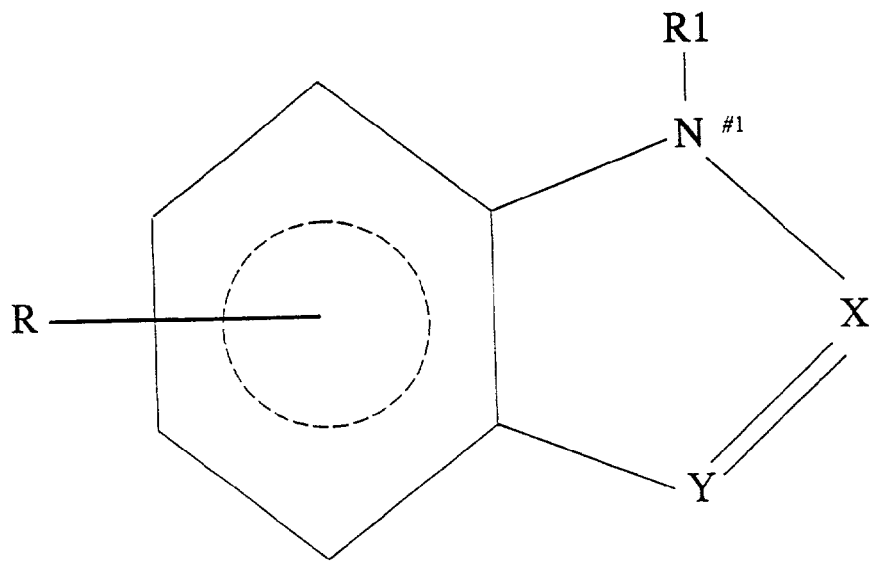
FIG. 4 is the molecular structure of a five membered aromatic fused N-heterocyclic ring compound with 1 to 3 nitrogen atoms in the fused ring, wherein none of the 1 to 3 nitrogen atoms in the fused ring is bonded to a hydrogen atom.

The optional coating promoter is a five membered aromatic fused N-heterocyclic ring compound with 1 to 3 nitrogen atoms in the fused ring, wherein none of the 1 to 3 nitrogen atoms in the fused ring are bonded to a hydrogen atom (see FIG. 4). Non-limiting examples of optional coating promoters suitable for use in the present invention include: 1-hydroxybenzotriazole (CAS 2592-95-2), 1-methylindole (CAS 603-76-9), 1-methylbenzotriazole (CAS 13351-73-0), 1-methylbenzimidazole (CAS 1632-83-3), 1-methylindazole (CAS 13436-48-1), 1-ethyl-indazole (CAS 43120-22-5), 1H-Indole, 1,5-dimethyl-indole (CAS 27816-53-1), 1,3-dimethyl-indole (CAS 875-30-9), methyl 1-(butylcarbamoyl)-2-benzimidazolecarbonate, 1-(chloromethyl)-1H-benzotriazole, and 1-aminobenzotriazole. While the coating promoter is optional in the present invention, if it is present then the uniformity enhancer can also be considered optional.

Referring to FIG. 4, the R substituents on the aromatic ring may be alkyl, hydroxyalkyl, aminoalkyl, nitroalkyl, mercaptoalkyl, or alkoxy groups containing from 1 to about 10 or more carbon atoms. The R1 substituents on the heterocyclic ring bonded to the nitrogen atom at the #1 position may be hydroxyl, amino, alkyl, hydroxyalkyl, aminoalkyl, nitroalkyl, mercaptoalkyl, or alkoxy groups. Specific examples of alkyl groups include methyl, ethyl, propyl, isopropyl, n-butyl, sec-butyl, tert-butyl, amyl, etc.

The formulation of the present invention is preferably made up with de-ionized water.

The composition of the present invention does not require halogen ions and can be essentially free of halogen ions, if desired. By "essentially free of halogen ions" we mean that the adhesion promoting composition is composed of less than about 0.01% by weight of halogen ions. We define "halogen ions" as fluoride, chloride, bromide or iodide ions or any combination or equivalent of these ions in aqueous solution. In addition, the composition of the present invention does not require a surfactant to achieve an excellent roughened copper surface.

Halogens can, however, be employed in the formulation if desired. For example, a small amount of chloride ion or other halide ions can be used in the formulation. Halides can be regarded as an optional ingredient in the present formulations.

In keeping with another aspect of the present invention, the process of preparing roughened copper surfaces suitable for subsequent multilayer lamination includes the following steps, some of which are optional:

(i) Providing a substantially clean copper surface, optionally by applying a highly built alkaline cleaning solution to a copper surface. The highly built alkaline cleaning solution comprises a surfactant and a phosphate or a phosphate ester.

(ii) Optionally dipping the substantially clean copper surface into a pre-dip to remove surplus cleaning solution from the copper surface providing a clean copper surface;

(iii) Applying to the clean copper surface a adhesion promoting composition consisting essentially of an oxidizer, a pH adjuster, a topography modifier, and a uniformity enhancer, as described above.

(iv) Optionally dipping the uniformly roughened copper surface into a post-dip to provide a roughened copper surface suitable for subsequent multilayer lamination. The optional post-dip is used to coat the roughened copper surface with a coating of organic molecules to enable enhanced bonding between the roughened copper surface and a suitable dielectric resin. The post-dip solution comprises an azole or silane compound. The post-dip may further comprise a titanate, zirconate, or aluminate.

Step (i) may further include draining excess cleaning solution from the copper surface.

Non-limiting examples of silanes for enhancing the bond strength between the copper surface and the dielectric include any trichloro or trimethoxy silane, especially those derivatives with at least one nitrogen atom such as trimethoxysilylpropyldiethylenetriamine. Other examples of silanes suitable for use in the present invention include:
3-methylacryloyloxypropyltrimethoxysilane,
3-(N-styrylmethyl-2aminoethylamino) propyltrimethoxysilane hydrochloride,
3-(N-allyl-2-aminoethylamino)-propyltrimethoxysilane hydrochloride,
N-(styrylmethyl)-3-aminopropyltrimethoxysilane hydrochloride,
N-2-aminoethyl-3-aminopropyltrimethoxysilane,
3-(N-Benzyl-2-aminoethylamino)-propyltrimethoxy silane hydrochloride,
beta-(3,4-epoxycyclohexyl) ethyltrimethoxysilane,
gamma-aminopropyl-triethoxy silane, gamma-glycidoxypropyltrimethoxysilane, and
vinyltrimethoxysilane.

Non-limiting examples of titanates that can be used in the present invention include:
  titanate amine,
  tetraocytl di(ditridecyl)phosphito titanate,
  tetra(2,2-diallyloxymethyl) butyl-di(ditridecyl)phosphito titanate,
  neopentyl(diallyl)oxytri(diocytl)pryo-phosphato titante, and neopentyl(diallyl)oxy tri(m-amino)phenyl titanate.

Non-limiting examples of suitable zirconates (available, for example, from Kenrich Petrochemicals, Inc., Bayonne, N.J.) include:
  KZ 55-tetra (2,2 diallyloxymethyl)butyl, di(ditridecyl)phosphito zirconate,
  NZ-01-neopentyl(diallyl)oxy, trineodecanoyl zirconate, and
  NZ-09-neopentyl(diallyl)oxy, tri(dodecyl)benzene-sulfonyl zirconate.

Further non-limiting examples of suitable zirconates include: tetra (2,2 diallyloxymethyl)butyl-di(ditridecyl) phosphito zirconate, and zirconium IV 2,2-dimethyl 1,3-propanediol.

Non-limiting examples of aluminates that can be used in the present invention include: Kenrich® diisobutyl(oleyl) acetoacetylaluminate (KA 301), and diisopropyl(oleyl)acetoacetyl aluminate (KA 322).

The topography of the copper surface is favorably modified by the present compositions, over and above the typical topography achieved by peroxide based etching solutions known in the art. Also, the uniformity and completeness of the topography modification and coating are well above what is typically seen in the art.

The adhesion promoting composition may optionally comprise a copper salt such as copper sulfate. The aqueous copper ions protect virgin stainless steel surfaces, such as those of a process tank, from chemical attack. Hence it is advantageous to include a quantity of copper salt in the adhesion promoting composition if the copper surface to be treated is dipped into a new or previously unused steel tank. However, there is no requirement to include a copper salt to obtain a highly satisfactory roughened copper surface.

One practical test that can be used to indicate the better adhesion of resins to the present copper surface is the well-known tape test for peel strength. Self-adhesive tape is adhered to a treated copper surface, then peeled off and examined to determine how much of the treated surface material is removed. Many conventional treated copper surfaces, subjected to the tape test, will transfer enough material to the tape to prevent it from adhering when subsequently placed in contact with a hard surface. The treated surfaces resulting from practicing the present invention, however, commonly transfer little or no material to the tape and do not prevent the tape from being readhered to another surface. This tape test result indicates that the present invention provides a desirable, tightly-adhering coating.

The following examples represent specific but nonlimiting embodiments of the present invention:

EXAMPLE 1

A copper surface was etched by 3% $H_2O_2$, 5% $H_2SO_4$, 5 g/l benzotriazole ("BTA"), balance deionized water ("DI"), with no uniformity enhancer or coating promoter (see Table 1). The etched copper surface was undesirably speckled with shiny spots of copper, indicating a non-uniform etch.

EXAMPLE 2

A copper surface was etched with the following composition: 3% $H_2O_2$, 5% $H_2SO_4$, 1.5 g/l BTA, balance DI, with no uniformity enhancer or coating promoter. The etched copper surface developed undesirable striations that were indicative of a non-uniform etch.

EXAMPLE 3

A copper surface was etched by: 3% $H_2O_2$, 5% $H_2SO_4$, 1.5 g/l BTA, 0.5 g/l 5-Aminotetrazole (uniformity enhancer), balance DI, with no coating promoter. The etched copper surface was desirably uniformly etched. This example demonstrates the value of the uniformity enhancer.

EXAMPLE 4

Figure 5:
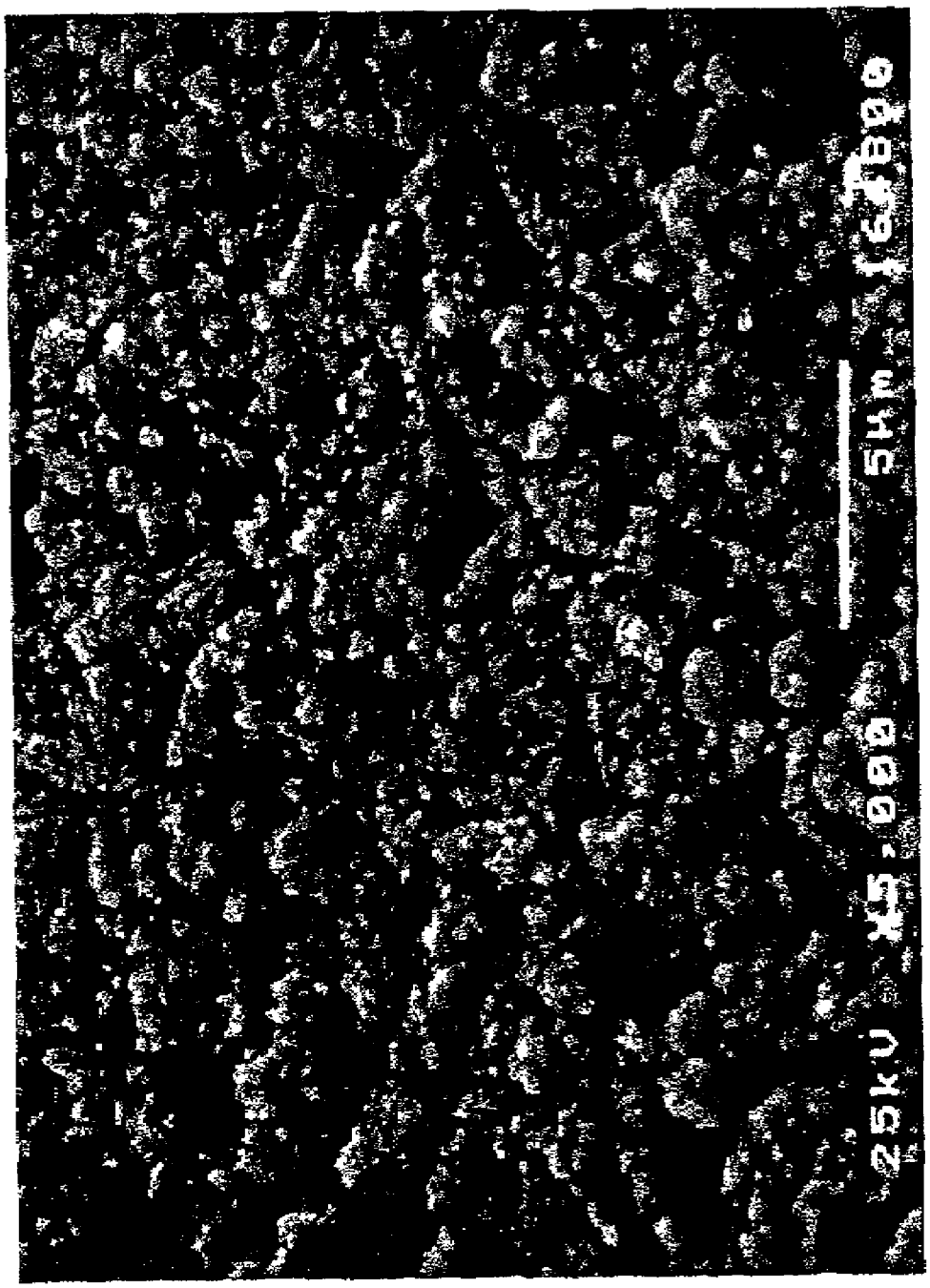
FIG. 5 is an scanning electron microscopic ("SEM") photograph of a copper surface that has been roughened according to the present invention, using as a treatment formulation: 3% $H_2O_2$, 5% $H_2SO_4$, 1.0 g/l BTA, 0.5 g/l 1-hydroxybenzotriazole (coating promoter), balance DI. The copper surface has been uniformly etched and covered in an organometallic coating.

A copper surface was etched using the following formulation: 3% $H_2O_2$, 5% $H_2SO_4$, 1.0 g/l BTA, 0.5 g/l 1-hydroxybenzotriazole (coating promoter), balance DI. A SEM photograph, FIG. 5, of the etched copper surface reveals a copper surface that has been uniformly etched and covered in a coating that is believed to be an organometallic coating.

EXAMPLE 5

A copper surface was etched, using as the etchant: 3% $H_2O_2$, 5% $H_2SO_4$, 1.0 g/l BTA, 2 g/l 1-hydroxybenzotriazole (coating promoter), balance DI.

EXAMPLE 6

A copper surface was etched, using as the etchant: 3% $H_2O_2$, 5% $H_2SO_4$, 1.5 g/l tolyltriazole (topography modifier), 0.05 g/l 5-mercaptomethyl tetrazole (uniformity enhancer), 2 g/l 1-hydroxybenzotriazole (coating promoter), and balance DI.

See Table 1 for a summary of examples 1 to 6.

While the invention is described above in connection with preferred or illustrative embodiments and examples, they are not intended to be exhaustive or limiting of the invention. Rather, the invention is intended to cover all alternatives, modifications and equivalents included within its spirit and scope of the invention, as defined by the appended claims.

TABLE 1

|   | Example 1 | Example 2 | Example 3 | Example 4 | Example 5 | Example 6 |
|---|---|---|---|---|---|---|
| Oxidizer | 3% $H_2O_2$ | 3% $H_2O_2$ | 3% $H_2O_2$ | 3% $H_2O_2$ | 3% $H_2O_2$ | 3% $H_2O_2$ |
| pH adjuster | 5% sulfuric acid | 5% sulfuric acid | 5% sulfuric acid | 5% sulfuric acid | 5% sulfuric acid | 5% sulfuric acid |

TABLE 1-continued

| | Example 1 | Example 2 | Example 3 | Example 4 | Example 5 | Example 6 |
|---|---|---|---|---|---|---|
| Topography modifier | 5 g/l benzo-triazole | 1.5 g/l benzo-triazole | 1.5 g/l benzo-triazole | 1 g/l benzo-triazole | 1 g/l benzo-triazole | 1.5 g/l tolyltriazole |
| Uniformity Enhancer | None | None | 0.5 g/l 5-amino-tetrazole | None | None | 0.05 g/l 5-mercapto-methyl tetrazole |
| Coating Promoter | None | None | None | 0.5 g/l 1-hydroxy benzo-triazole | 2 g/l 1-hydroxy benzo-triazole | 2 g/l 1-hydroxy benzo-triazole |
| D.I. water | Balance | Balance | Balance | Balance | Balance | Balance |
| Comments | Speckled | Striations | Uniform etch | Uniform etch Organo-metallic coating | — | — |
| RESULT | Defect | Defect | No defect | No defect | — | — |

The invention is:

1. A process for preparing roughened copper surfaces suitable for subsequent multilayer lamination, said process comprising the steps of: contacting with a clean copper surface an adhesion promoting composition under conditions effective to provide a roughened copper surface, said adhesion promoting composition consisting essentially of:
hydrogen peroxide;
a pH adjuster;
a 5-membered aromatic fused N-heterocyclic ring compound, wherein the N-heterocyclic ring has a nitrogen atom at position 1 bonded to a hydrogen atom; and
a uniformity enhancer having the formula:

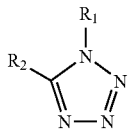

wherein $R_1$ and $R_2$ are independently selected from hydrogen or hydroxyl, amino, alkyl, hydroxyalkyl, aminoalkyl, nitroalkyl, mercaptoalkyl, or alkoxy groups;
wherein said adhesion promoting composition is at least essentially free of halogen ions.

2. The process according to claim 1, wherein said process is preceded with the step of cleaning said copper surface.

3. The process according to claim 1, wherein said process further comprises the step of contacting the uniform roughened copper surface with a post-dip.

4. The process according to claim 3, wherein said post-dip comprises an azole or silane compound or a combination of said azole and said silane.

5. The process according to claim 4, wherein said post-dip further comprises a titanate, zirconate, aluminate or a combination of said titanate, zirconate and aluminate.

6. The process of claim 4, wherein said silane is selected from the group consisting essentially of
3-methylacryloyloxypropyltrimethoxysilane,
3-(N-styrylmethyl-2aminoethylamino) propyltrimethoxysilane hydrochloride,
3-(N-allyl-2-aminoethylamino)-propyltrimethoxysilane hydrochloride,
N-(styrylmethyl)-3-aminopropyltrimethoxysilane hydrochloride,
N-2-aminoethyl-3-aminopropyltrimethoxysilane,
3-(N-Benzyl-2-aminoethylamino)-propyltrimethoxy silane hydrochloride,
beta-(3,4-epoxycyclohexyl) ethyltrimethoxysilane,
gamma-aminopropyl-triethoxy silane,
gamma-glycidoxypropyltrimethoxysilane, and
vinyltrimethoxysilane.

7. The process of claim 5, wherein said titanate is selected from the group comprising titanate amine, tetraocytl di(d-itridecyl)phosphito titanate, tetra(2,2-diallyloxymethyl) butyl-di(ditridecyl)phosphito titanate, and neopentyl(diallyl)oxy-tri (dioctyl)pyrophosphatotitanate, and neopentyl (diallyl)oxytri-(m-amino)phenyl titanate.

8. The process of claim 5, wherein said zirconate is selected from the group comprising tetra (2,2 diallyloxymethyl)butyl, di(ditridecyl)phosphito zi rconate, neopentyl (diallyl)oxy, trineodecanoyl zirconate, neopentyl(diallyl) oxy, tri(dodecyl)benzene-sulfonyl zirconate, tetra (2,2 diallyloxymethyl)butyl-di (ditridecyl)phosphito zirconate, and zirconium IV 2,2-dimethyl 1,3-propanediol.

9. The process of claim 5, wherein said aluminate is selected from the group comprising diisobutyl(oleyl)acetoacetylaluminate, and diisopropyl(oleyl)acetoacetyl aluminate.

10. The process according to claim 1, wherein said uniformity enhancer is 5-aminotetrazole.

11. The process according to claim 1, wherein said adhesion promoting composition further consists essentially of a copper salt.

12. The process according to claim 2, wherein said step of cleaning said copper surface comprises the step of applying a cleaning solution to said copper surface.

13. The process according to claim 12, wherein said step of cleaning said copper surface further comprises the step of draining excess cleaning solution from the copper surface.

14. The process according to claim 1, wherein said uniformity enhancer is selected from the group consisting of 5-aminotetrazole; 5-methyltetrazole; 5-methylaminotetrazole; 1H-tetrazol-5-amine; 1H-tetrazol-5-amine, N, N-dimethyl-1-methyltetrazole; 1-methyl-5-mercaptotetrazole, 1,5-dimethyltetrazole; 1-methyl-5-aminotetrazole; and 1-methyl-5-methylamino-tetrazole.

* * * * *